(12) United States Patent
Saito et al.

(10) Patent No.: US 6,275,118 B1
(45) Date of Patent: Aug. 14, 2001

(54) PUSH-PUSH OSCILLATOR

(75) Inventors: Noriaki Saito; Hiroyuki Yabuki, both of Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/449,088

(22) Filed: Nov. 24, 1999

(30) Foreign Application Priority Data

Nov. 24, 1998 (JP) .................................................. 10-332422
Apr. 27, 1999 (JP) .................................................. 11-119463
May 6, 1999 (JP) .................................................. 11-125815

(51) Int. Cl.$^7$ .............................. H03B 5/18; H03L 7/099
(52) U.S. Cl. .................................. 331/96; 331/56; 331/60; 331/76; 331/100; 331/114; 331/117 D; 331/102; 331/101; 331/177 V; 331/36 C; 455/260
(58) Field of Search .................................. 331/34, 36 C, 331/56, 60, 76, 96, 99–102, 117 R, 117 FE, 117 D, 177 V; 455/260

(56) References Cited

U.S. PATENT DOCUMENTS

| 4,754,236 | * | 6/1988 | Mamodaly et al. ........... 331/117 FE |
| 5,138,284 | * | 8/1992 | Yabuki et al. ........................ 331/56 |
| 5,250,910 | * | 10/1993 | Yabuki et al. ........................ 331/56 |
| 5,406,235 |   | 4/1995 | Hayashi . |

FOREIGN PATENT DOCUMENTS

| 0527470 | 8/1992 | (EP) . |
| 0696843 | 2/1996 | (EP) . |
| 6-73910 | 10/1994 | (JP) . |

OTHER PUBLICATIONS

Z. Nativ et al., "Push–Push VCO Design with CAD Tools," Feb., 1989, pp. 127–130 and 132, Microwave Journal.
H. Yabuki et al., "An Experimental Study on Frequency Synthesizers Using Push–Push Oscillators," Jun., 1993, pp. 932–937, IEICE TOE.
European Search Report, application no. 99121207.7, dated Mar. 10, 2000.

* cited by examiner

Primary Examiner—David Mis
(74) Attorney, Agent, or Firm—Ratner & Prestia

(57) ABSTRACT

A push—push oscillator is formed by (a) a resonator circuit including a transmission line having one-half wavelength and both ends of the line being left open, and a capacitance for frequency control coupled to the transmission line in parallel, and (b) two oscillators electrically identical to each other and their input sections being coupled to both the ends of the transmission line. Further, this oscillator can take out an output signal of even-order-harmonics from a midpoint of the transmission line in a transmitting direction as well as take out two fundamental waves from respective output sections of two branch oscillators. This push—push oscillator operating with a high frequency is downsized and simplified from a conventional one. Its phase-noise-characteristics and noise immunity are also improved.

11 Claims, 9 Drawing Sheets

PUSH-PUSH OSCILLATOR

FIELD OF THE INVENTION

The present invention relates to a push—push oscillator employed in a wireless communication apparatus and measuring instrument, both of which handle high-frequency-bands.

BACKGROUND OF THE INVENTION

The push—push oscillator, in general, uses a resonator which electrically resonates at an oscillating frequency. FIG. 10A through FIG. 10C illustrate this prior art. FIG. 10A and FIG. 10B depict resonators employed in the prior art. The resonator in FIG. 10B is a hairpin resonator which is transformed from the resonator in FIG. 10A. Both the resonators are electrically almost identical. Resonators formed by a transmission line such as a stripline have been widely used. This resonator is disclosed in the document of "Integrated Circuit for Microwave" written by Yoshihiro Konishi and published from "SAMPO" in 1973. FIG. 10C illustrates an entire circuit of the oscillator, which is disclosed in the document of "Push—Push VCO Design with CAD Tools" written by Zvi Nativ and Yair Shur, and published from Microwave Journal in February 1989. Japanese Utility Model Publication No. H06-73910 also teaches this idea. The oscillator in FIG. 10C comprises the following elements.

(a) resonator circuit 102 comprising a transmission line which length being one-half wavelength of a fundamental wave, and both the ends being left open;

(b) oscillator circuit 105 comprising two branch oscillators 103 and 104 employing Colpitts oscillator and the like, the two branch oscillators being electrically identical;

(c) in-phase addition circuit 106 comprising two transmission lines having an equal electrical length and another transmission line; and (d) output terminal 107.

Two output signals tapped off from circuit 105 include fundamental wave components, and its odd-order as well as even-order harmonics-wave-components. The fundamental wave component and its odd-order harmonic-wave-component are cancelled by circuit 106, whereby they are scarcely supplied to output terminal 107; however, the even-order harmonic-wave-component is added in-phase by circuit 106 and supplied from terminal 107. This oscillator yet has one output terminal as FIG. 10C illustrates and an output signal obtained therefrom is thus nothing but a single phase. Comparing with a regular circuit which obtains even-order-harmonics by multiplying an output signal supplied from a single oscillator, this oscillator needs an in-phase addition circuit which occupies a physically large space. Further, when this oscillator is employed in a PLL frequency synthesizer, the output signal of the oscillator must be supplied to two circuits, i.e. a PLL circuit and an external circuit, although the oscillator has one output terminal, which eventually demands additional circuits.

The conventional oscillator discussed above has the following problems:

(1) The oscillator is not adequate for devices and instruments which need to be smaller in size, because it requires not only large dimensions but also needs a complex structure.

(2) When the oscillator is employed in the PLL frequency synthesizer, the output cannot be fed into a differential amplifier in double phases. As a result, a noise suppression function proper to the differential amplifier cannot be utilized, which entails the needs of improving the noise immunity of the PLL frequency synthesizer.

(3) Since a stripline is used in a transmission line of the resonator circuit, the quality factor (Q) of the resonator is obliged to be suppressed at a certain level. The phase noise characteristics of the oscillator thus remains at unsatisfactory level.

The conventional oscillators and the devices or instruments employing the oscillators have a limit to be downsized, and need improvement in noise characteristics.

SUMMARY OF THE INVENTION

The present invention aims to address the problems discussed above and provide a push—push oscillator smaller as well as simpler and having better noise characteristics than the conventional one. The present invention also aims to provide devices or instruments which can accommodate and utilize this push—push oscillator.

The push—push oscillator of the present invention comprises the following elements:

(a) a resonator circuit comprising a transmission line of which both ends are left open and a frequency-control-capacitance coupled to the transmission line in parallel;

(b) an oscillator circuit comprising two branch oscillators of which ends are coupled to the input side of respective branch oscillators;

(c) two output terminals of a fundamental wave, coupled to the outside of respective branch oscillators; and (d) an even-order harmonic output terminal coupled to a midpoint on the transmission line of the resonator circuit.

The construction discussed above allows the oscillator to supply output signals as a fundamental wave and an even-order harmonic from respective output terminals separately provided thereon. Further, this oscillator can eliminate an in-phase addition circuit which has been employed in a conventional oscillator. When this oscillator is employed in a PLL frequency synthesizer (hereinafter called a PLL synthesizer), the fundamental wave can be input into a differential amplifier—an element of a phase-lock-loop integrated circuit (PLL IC)—in double phases so that noise immunity can be improved. In this specification, the "double phases" means two signals in different phases by 180°, and a "single phase" does not always mean a single signal but it is used in contrast with the meaning of this "double phase".

An even-order harmonic output terminal of the oscillator can be replaced with an even-order harmonic input terminal. Further, when the even-order harmonic is fed into this input terminal, fundamental waves in an injection-locked condition can be taken out from the two output terminals of fundamental wave. In other words, this oscillator functions as a frequency divider.

The oscillator of the present invention can be further equipped with the following elements in addition to the resonator circuit and oscillator circuit.

an in-phase addition circuit for adding output signals from the respective branch oscillators;

an even-order harmonic output terminal coupled to an output side of this in-phase addition circuit;

a transmission line coupled by rf magnetic field with the transmission line near its midpoint in the resonator circuit; and two fundamental-wave-output-terminals coupled to both the ends of the coupled transmission line.

The construction discussed above allows the oscillator to supply output signals as a fundamental wave and an even-order harmonics from respective output terminals separately provided thereon. When this oscillator is employed in a PLL synthesizer, the fundamental wave can be input into a differential amplifier an element of a phase-lock-loop integrated circuit (PLL IC) in double phases so that a noise immunity cam be improved.

The construction discussed above can be reworded as follows:

(1) a fundamental wave is tapped off in double phases from the oscillator circuit, and the even-order-harmonic is tapped off in a single phase by coupling with rf electric field at the midpoint on the transmission line;

(2) the even-order-harmonic is fed into the oscillator circuit in a single phase by coupling with rf electric field at the midpoint on the transmission line; and (3) a fundamental wave is tapped off in double phases from the oscillator circuit by coupling with rf magnetic field at the midpoint on the transmission line, and the even-order-harmonic is tapped off in a single phase from the oscillator circuit via the in-phase addition circuit.

This construction allows the oscillator and a PLL synthesizer or a wireless communication apparatus employing the oscillator to be downsized and simplified, which eventually contributes to power saving of these devices. This construction also improves noise immunity as well as phase noise characteristics. This oscillator operates as an injection-locked oscillator so that it functions as a frequency divider.

DESCRIPTION OF THE EXEMPLARY EMBODIMENTS

Before the exemplary embodiments are described, a fundamental background of this component is briefed hereinafter.

(1) Common elements to the push—push oscillators of the present invention are a resonator circuit and an oscillator circuit□both are essential elements for the oscillators. The resonator circuit resonates at one-half of the fundamental wavelength, both the ends the circuit are thus 180 degrees out of phase based on the theory of transmission line. This resonance waves are fed into two independent branch-oscillators and are amplified before being tapped off. These two branch oscillators are electrically identical, and thus phase differences produced between respective inputs and outputs are the same. The phase differences at output sides of both the branch oscillators are kept at 180 degrees□ the same value at their input sides. On the other hand, operating in a non-linear manner, the oscillator circuit is a feedback amplifier. Therefore, in addition to the input signal, other harmonics (signals) having a frequency of integral multiple of an input signal are produced at input and output sides of the oscillator circuit, i.e. at the resonance circuit and output sides of both the branch oscillators. Output signals from the oscillator of the present invention are taken out from at least one of these signals.

(2) Some of the output signals can be taken out in double phases. Thus a differential amplifier prepared in the later stage can receive these signals in double phases when the oscillator is employed in a PLL synthesizer. The differential amplifier is known in general for the following two functions.

(2-1) When signals in double phases is fed into the differential amplifier, the in-phase components of the signals are cancelled and thus only opposite-phase components are amplified. Comparing with a case where single-phase signals are fed, the opposite-phase components are doubled before being tapped off.

(2-2) Noises of in-phase components are also cancelled as same as the signals, therefore the noise components included in output signals are reduced to the half comparing with the case where signals in single phase are fed into the differential amplifier.

(3) A stripline resonator, which is an essential element of the oscillator circuit, is subjected to the greater transmission loss and lower Q-factor in the resonator circuit comparing with a coaxial resonator. The phase noise contained in output signals of an oscillator is generally known for decreasing at greater value of this Q-factor.

The exemplary embodiments of the present invention are demonstrated hereinafter with reference to the accompanying drawings.

Exemplary Embodiment 1

Figure 1:
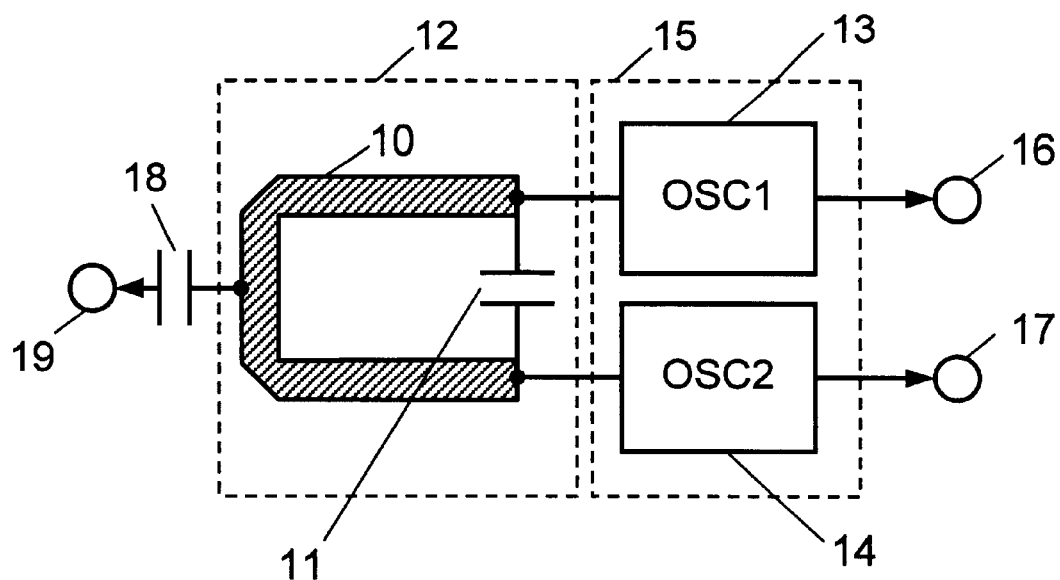
FIG. 1 is a block diagram of a push—push oscillator in accordance with a first exemplary embodiment of the present invention.

FIG. 1 is a block diagram of a push—push oscillator in accordance with the first exemplary embodiment of the present invention. A resonance frequency of resonator circuit 12 in FIG. 1 is determined mainly by an electrical length of transmission line 10 and controlled finely by frequency-control-capacitance 11. Oscillator circuit 15 comprises two branch resonators 13 and 14, both of which are electrically identical. This oscillator of the present invention substantially differs from a conventional one in the following points:

(1) This oscillator has fundamental-wave-output-terminals 16 and 17 on the output sides of branch oscillators 13 and 14.

(2) This oscillator has even-order-harmonics-output-terminal 19 at the midpoint of transmission line 10.

(3) This oscillator does not have in-phase addition circuit at the output side of oscillator circuit 15.

Since line 10 resonates with one-half of the wavelength at the fundamental frequency, the fundamental wave shows its maximum voltage at both the ends of line 10 and minimum voltage at the midpoint (a virtual short-circuited point). The midpoint thus receives the maximum voltage for the even-order harmonics, while it receives the minimum voltage, i.e. zero (0) voltage, for the odd-order harmonics. Odd-order harmonics at zero voltage do not couple by rf electric field via coupling capacitance 18, and eventually only even-order harmonics couple, which can be thus selectively taken out. As such, this oscillator can output the fundamental wave and even-order harmonics independently at the same time from respective output terminals disposed at the oscillator. Further, this oscillator needs not the in-phase addition circuit which the conventional oscillator has employed, thus not only the oscillator per se but also the devices or instruments which employ this oscillator can be downsized and simplified. The oscillator in accordance with the first embodiment takes out the fundamental wave from terminals 16 and 17 in double phases, therefore when this oscillator is employed in a PLL synthesizer, the fundamental wave can be fed into the differential amplifier an element making up a PLL IC in double phases, and as a result, the noise immunity of PLL synthesizer can be improved.

In this embodiment, capacitance 11 is a fixed capacitance but it can be replaced with a variable-capacitance-element with the same effect. Capacitance 18 can be disposed outside terminal 19, i.e. outside of the oscillator with the same effect. This can be applicable to not only capacitance 18 but also other types of coupling capacitance used in other embodiments, the descriptions of these alternatives are thus omitted hereinafter.

Exemplary Embodiment 2

Figure 2:
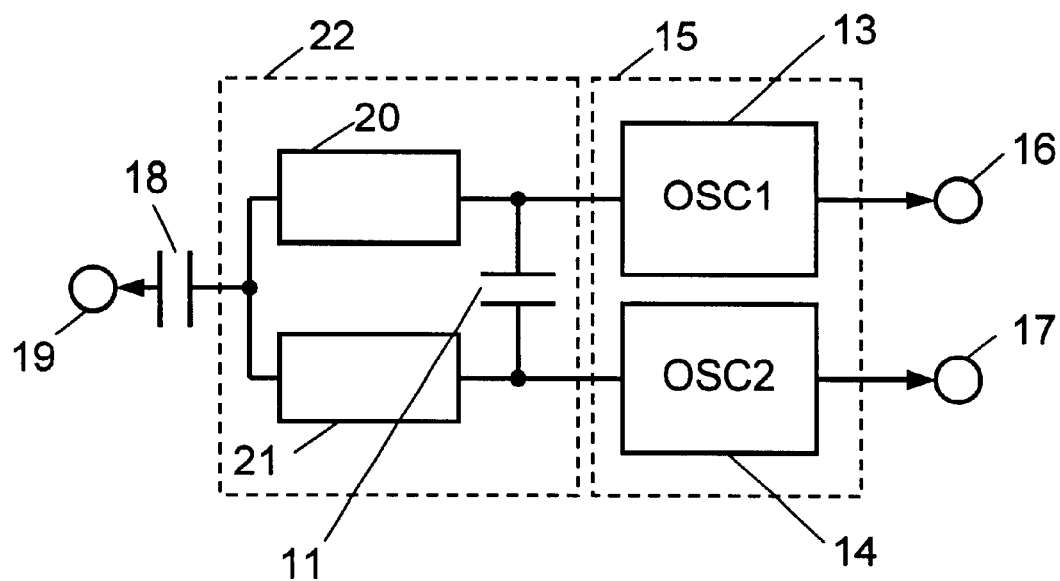
FIG. 2 is a block diagram of a push—push oscillator in accordance with a second exemplary embodiment of the present invention.

FIG. 2 is a block diagram of a push—push oscillator in accordance with the second exemplary embodiment of the present invention. In FIG. 2, elements 11, and elements 13 through 19 are the same in the first exemplary embodiment. Two branch coaxial resonators 20 and 21 electrically identical have electrical length of one quarter of fundamental wavelength and are constructed as follows: these two coaxial resonators, of which respective first ends are open and respective second ends are short-circuited, should be left open at both respective ends. At each end, inner conductors are coupled with each other and outer conductors are coupled with each other. When both the outer conductors share the ground-plane, they need not to be coupled with each other. The inner conductors of the coaxial resonator, of which both ends are left open and have electrical length of one half of fundamental wavelength, are in general covered by the outer conductor (ground-plane) except its both ends. Therefore, the minimum voltage point at the fundamental wave, i.e. a point on the inner conductor corresponding to the midpoint of the coaxial resonator, cannot be taken out to the outside. However, in the two coaxial resonators where the inner and outer conductors are short-circuited at their respective first ends, the short-circuited faces are left open so that respective inner conductors can be taken out to the outside. Those inner conductors are coupled as discussed above so that these coupling points can work in an electrical way equivalent to the midpoint of the first embodiment. In other words, even-order harmonics can be coupled by rf electric field and then taken out via capacitance 18 selectively as same as the first embodiment. A great advantage of this second embodiment is that a coaxial resonator of high Q-factor can be employed in the resonator circuit, so that phase-noise-characteristics of the oscillator is improved.

Exemplary Embodiment 3

Figure 3A:
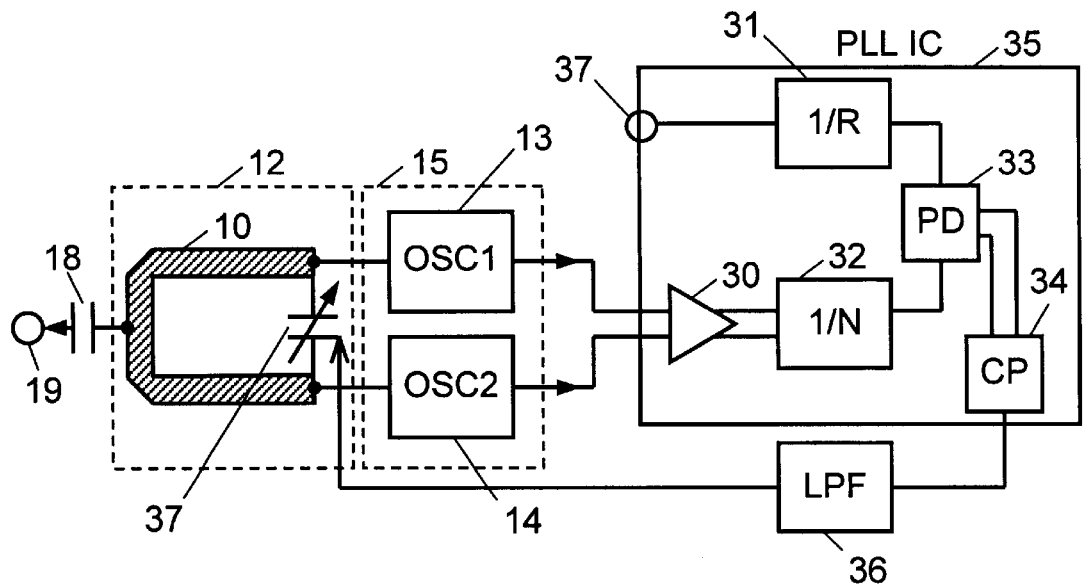
FIG. 3A and FIG. 3B are block diagrams of a PLL synthesizer employing a push—push oscillator in accordance with a third exemplary embodiment of the present invention.

FIG. 3A is a block diagram of a PLL synthesizer employing a push—push oscillator in accordance with the third exemplary embodiment of the present invention. This third embodiment employs a PLL synthesizer in addition to the first embodiment. Elements 10, 13–15, and 18–19 in FIG. 3*a* are the same as those in the first embodiment. Block 35 is a PLL IC available on the market. Frequency divider 31 has a division number of integer "R", and frequency divider 32 has a division number of integer "N". An output signal of the oscillator is fed into frequency divider 32 in double phases, then turned to a signal having a 1/N divided frequency. A fundamental frequency fed into input terminal 37 of IC 35 is divided by frequency divider 31 into 1/R and then turned to a signal accordingly. Phase comparator 33 detects phase errors between these two signals and inputs the resultant errors into charge pump 34, which then produces current pulses having pulse-widths responsive to sizes of each error signal and supplies the current pulses to the outside. Low-pass-filter (LPF) 36 removes ac components from the current pulses and then outputs a dc voltage. This dc voltage controls a voltage-controlled capacitance 37 so that the circuit in FIG. 3*a* can function as a PLL. In this third embodiment, oscillator circuit 15 and differential amplifier 30 can be coupled in double phases so that output power of circuit 15 can be reduced approximately by 3 dB comparing with the coupling in a single phase. Further, in-phase component of external noises can be suppressed so that noise immunity of the PLL synthesizer is improved. Since this oscillator can output the fundamental wave and even-order harmonics independently at the same time from respective output terminals disposed at the oscillator, the PLL synthesizer can be downsized and simplified. This oscillator has another advantage that it can save power comparing with the conventional oscillator which supplies even-order-harmonics to a PLL IC and takes out the harmonics as output signals to the external circuit.

Figure 3B:
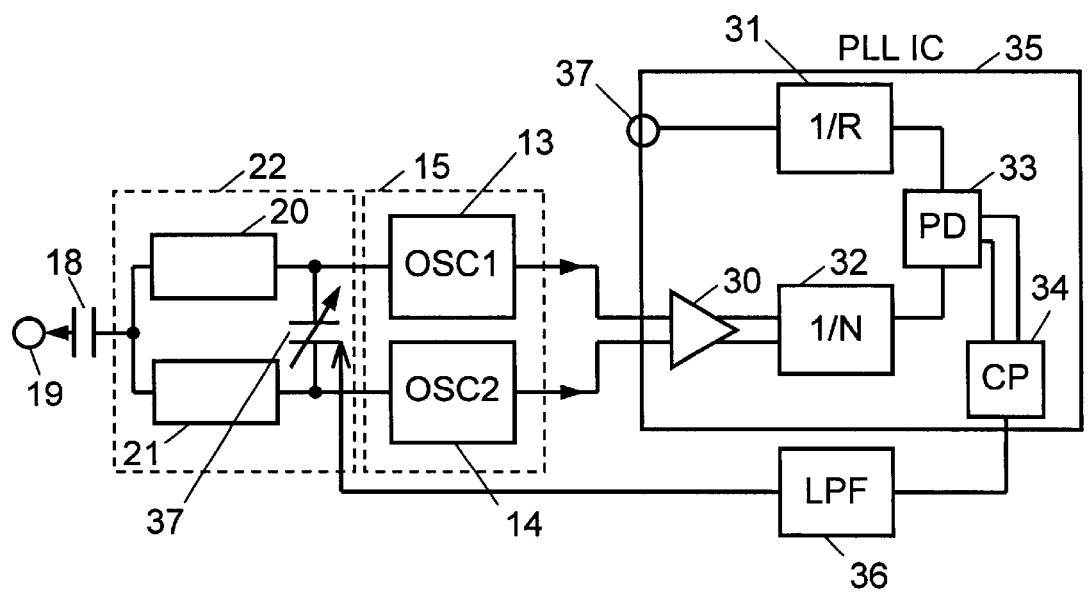

Oscillator circuit 15 of this embodiment can be included in IC 35, or on the contrary, parts of differential amplifier 30 and frequency divider 31 can be outside IC 35 with the same effect. Resonator circuit 22 can be formed by capacitance 11 and coaxial resonators 20 and 21 as shown in FIG. 3*b* with the same effect. In addition, resonator circuit 22 can improve phase noise characteristics of the oscillator as same as the second embodiment.

Exemplary Embodiment 4

Figure 4:
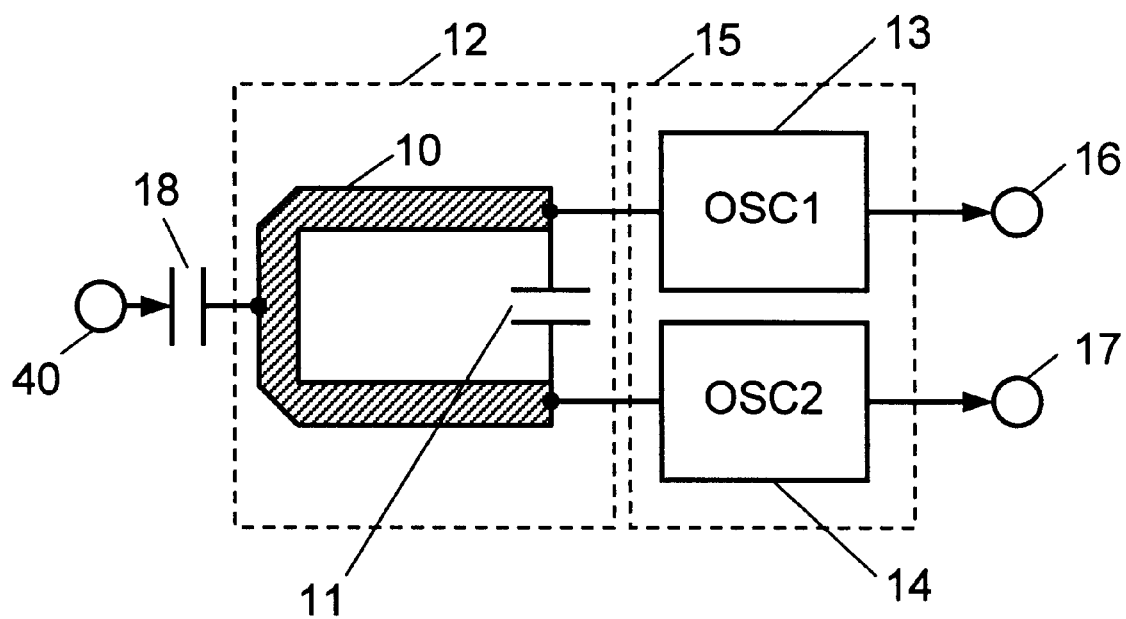
FIG. 4 is a block diagram of a push—push oscillator in accordance with a fourth exemplary embodiment of the present invention.

FIG. 4 is a block diagram of a push—push oscillator in accordance with the fourth exemplary embodiment of the present invention. Resonator circuit 12 comprising transmission line 10 and capacitance 11, and oscillator circuit 15 comprising branch oscillators 13 and 14 are the same as those in the first embodiment. This oscillator of the present invention substantially differs from a conventional one in the following points:

(1) This oscillator has fundamental-wave-output-terminals 16 and 17 on the output sides of branch oscillators 13 and 14.

(2) This oscillator has even-order-harmonics-input-terminal 40 at the midpoint of transmission line 10.

As discussed in the first embodiment, the midpoint of line 10 receives the maximum voltage i.e. the maximum strength of rf electric field for the even-order harmonics. When even-order harmonics are fed into this point via coupling capacitance 18, the coupling by rf electric field can be easily achieved by even-order harmonics because they have the maximum strength of rf electric field at this point. In other words, this midpoint is in a high injection sensitivity for even-order harmonics. An injection-locked condition can be realized with ease by forcibly inputting a high frequency signal approximately equal to the even-order harmonic into input terminal 40, the fundamental wave injection-locked can be thus tapped off from terminals 16 and 17 in double phases.

As discussed in the second embodiment, transmission line 10 can be replaced with a coaxial resonator with the same effect. This oscillator also improves phase noise characteristics of the oscillator as same as the second embodiment.

Exemplary Embodiment 5

Figure 5A:
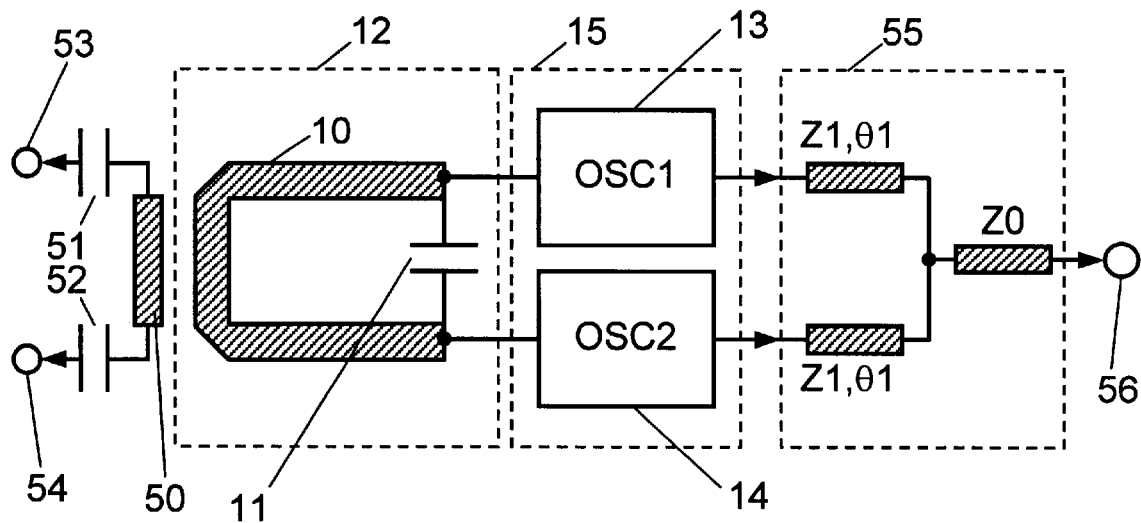
FIG. 5A is a block diagram of a push—push oscillator in accordance with a fifth exemplary embodiment of the present invention.

FIG. 5A is a block diagram of a push—push oscillator in accordance with the fifth exemplary embodiment of the present invention. Resonator circuit 12 comprising transmission line 10 and capacitance 11, and oscillator circuit 15 comprising branch oscillators 13 and 14 are the same as those in the first embodiment. Further this fifth embodiment adds in-phase addition circuit 55 to an output side of oscillator circuit 15 so that even-order harmonics can be tapped off from even-order-harmonic-output-terminal 56. This oscillator substantially differs from a conventional one in the following points:

(1) Coupling line 50 is paralleled with and disposed closely to transmission line 10.

(2) Line 50 is equipped with fundamental-wave-output-terminals 53 and 54 at its both ends.

The midpoint of transmission line 10 receives the minimum voltage of the fundamental wave, i.e. the maximum current. Thus when line 10 and line 50 are coupled by rf magnetic field near this midpoint as shown in FIG. 5A, the voltages of the fundamental wave produced at both the ends of line 10 appear in double phases at both the ends of line 50. Accordingly, these voltages can be taken out from terminals 53 and 54 in double phases via capacitances 51 and 52.

This oscillator can output the fundamental wave and even-order harmonics independently at the same time from respective output terminals disposed at the oscillator. Thus not only the oscillator per se but also the devices or instruments which employ this oscillator can be downsized and simplified. This is the same effect that the first embodiment has produced. The outlets of the fundamental wave and even-order harmonics are symmetric with those of the first embodiment, i.e. in this embodiment, the fundamental wave is taken out from the resonator circuit, and the even order harmonics are taken out from the oscillator circuit. When this oscillator is employed in a PLL synthesizer, the fundamental wave can be fed into the differential amplifier an element making up a PLL IC in double phases, and as a result, the noise immunity of PLL synthesizer can be improved.

Figure 5B:
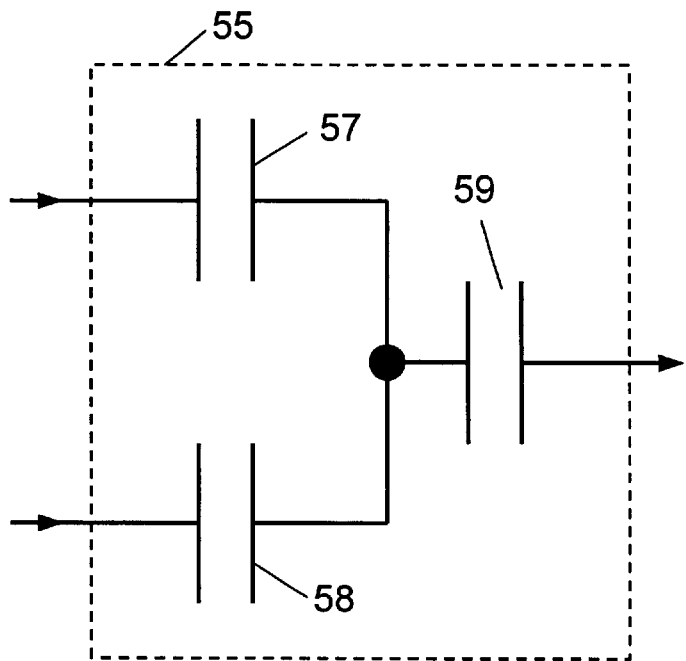
FIG. 5B is a circuit diagram of a simple in-phase addition circuit used in the fifth exemplary embodiment of the present invention.

Capacitance 11 in this embodiment can be replaced with a variable capacitance component, and circuit 55 can be replaced with a simple in-phase addition circuit formed by coupling capacitances 57–59 as shown in FIG. 5b with the same effect.

Exemplary Embodiment 6

Figure 6:
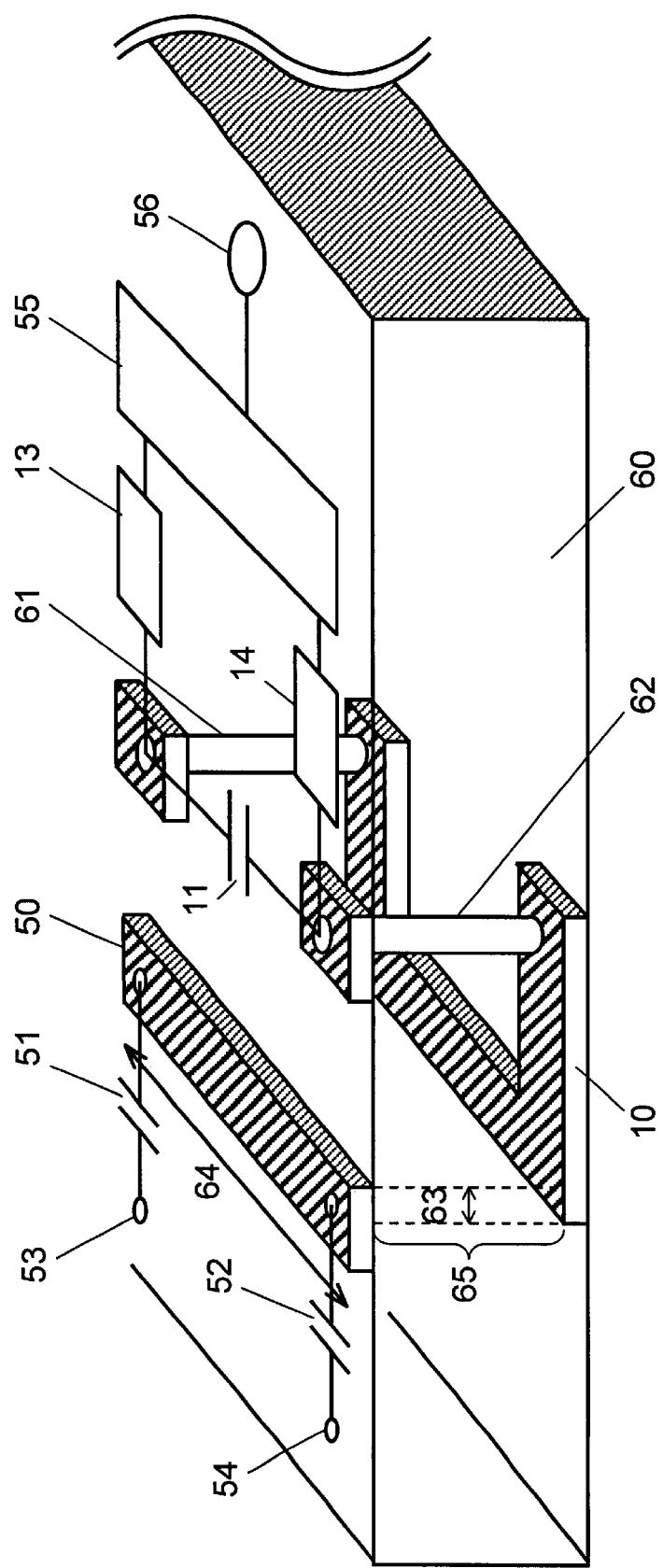
FIG. 6 is a perspective view of a push—push oscillator in accordance with a sixth exemplary embodiment of the present invention.

FIG. 6 is a perspective view of a push—push oscillator in accordance with the sixth exemplary embodiment of the present invention. Elements 10, 11, 13, 14 and 50–56 used in this sixth embodiment are the same as those in the fifth embodiment. Dielectric layer 60 is an element of coupling line 50 and transmission line 10. The transmission line and coupling line comprise respective strip conductors, dielectric layers and grounding planes in a strict meaning; however, because these distinctions are not needed in this specification, the strip conductor is referred to as these lines. Both ends of line 10 are pulled up to the upper faces of the dielectric layer through conductive through-holes 61 and 62. In this sixth embodiment, this oscillator can also output the fundamental wave and even-order harmonics independently at the same time from respective output terminals disposed at the oscillator, which is the same effect as the fifth embodiment. Thus not only the oscillator per se but also the devices or instruments which employ this oscillator can be downsized and simplified. This sixth embodiment further prepares additional arrangement, i.e. line 50 and line 10 sandwich the dielectric layer 60 in between as shown in FIG. 6 so that the area occupied by the oscillator can be narrowed. The electric coupling strength (coupling factor) of lines 10 and 50 is adjustable by the overlaid area (63×64) of respective lines and the thickness 65 of dielectric layer. Accordingly, output power of the fundamental wave is adjustable. Since other operations as an oscillator are the same as those in the fifth embodiment, the descriptions thereof are omitted. In this embodiment, coupling line 50 is disposed on the upper face and transmission line 10 is disposed on the lower face; however, they can be upside down with the same effect.

Exemplary Embodiment 7

Figure 7:
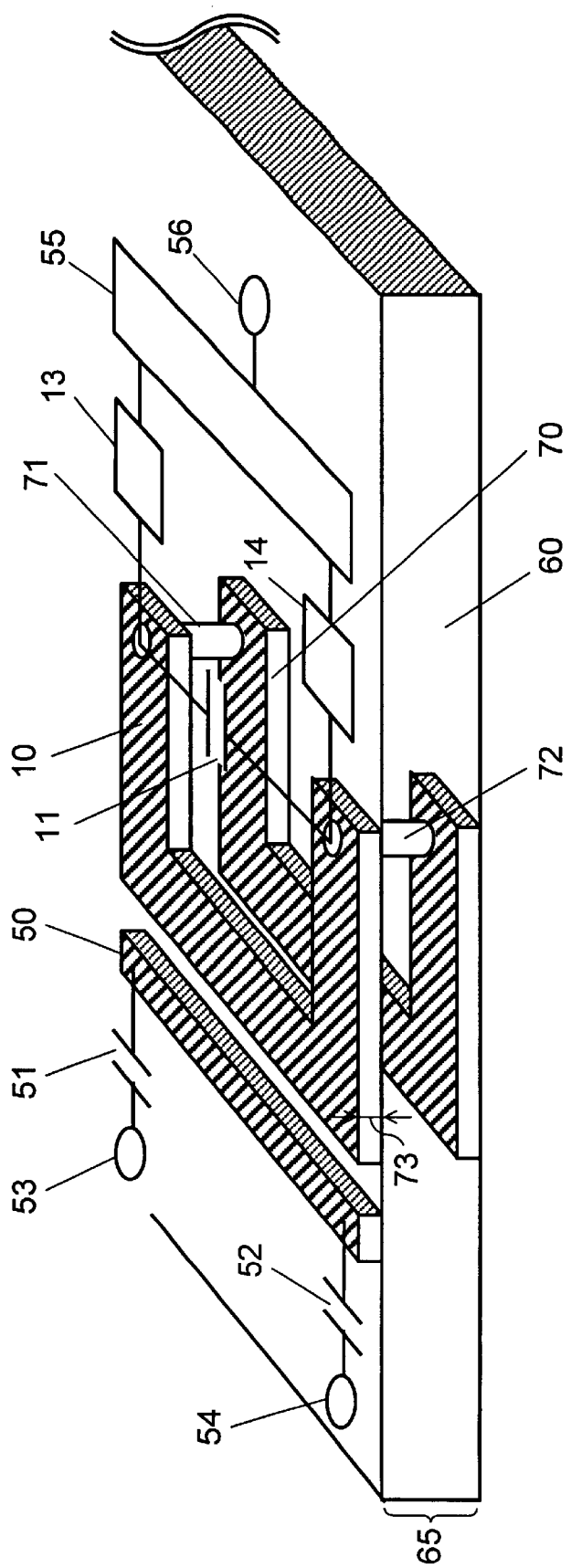
FIG. 7 is a perspective view of a push—push oscillator in accordance with a seventh exemplary embodiment of the present invention.

FIG. 7 is a perspective view of a push—push oscillator in accordance with the seventh exemplary embodiment of the present invention. Elements 10, 11, 13, 14 and 50–56 used in this seventh embodiment are the same as those in the fifth embodiment, and element 60 is the same as that in the sixth embodiment. The descriptions of these elements are thus omitted here. In this seventh embodiment, this oscillator can also output the fundamental wave and even-order harmonics independently at the same time from respective output terminals disposed at the oscillator, which is the same effect as the sixth embodiment. Transmission line 70 has the same shape and occupies the same area as transmission line 10. Respective lines 10 and 70 are formed on different faces of dielectric layer 60, and sandwich layer 60 in between so that both the lines overlay with each other completely. Therefore, line 70 could be disposed free from increasing area occupied by the oscillator. As a result, not only the oscillator per se but also the devices or instruments which employ this oscillator can be downsized and simplified. This is the same effect as the fifth embodiment.

The thickness of lines 10 and 70 is indicated by dimension 73. Conductive through-holes 71 and 72 couple respective ends of lines 10 and 70 as shown in FIG. 7. When a transmission line is formed in an integrated circuit, thickness 73 of strip conductor is, in general, thinner than the skin depth of the conductor. A surface resistance of the strip conductor at a high frequency thus grows, thereby increasing transmission loss. As shown in FIG. 7, respective ends of two lines can be coupled with through holes 71 and 72, whereby high-frequency-current running in the transmission line is divided into these two lines. Surface resistance can be thus practically reduced to a half. As a result, Q-factor of the resonator is raised and phase-noise-characteristics of the oscillator are improved. Further, this seventh embodiment produces another advantage of reducing dc loss of the resonator. Other operations as an oscillator are the same as those in the fifth embodiment.

Exemplary Embodiment 8

Figure 8:
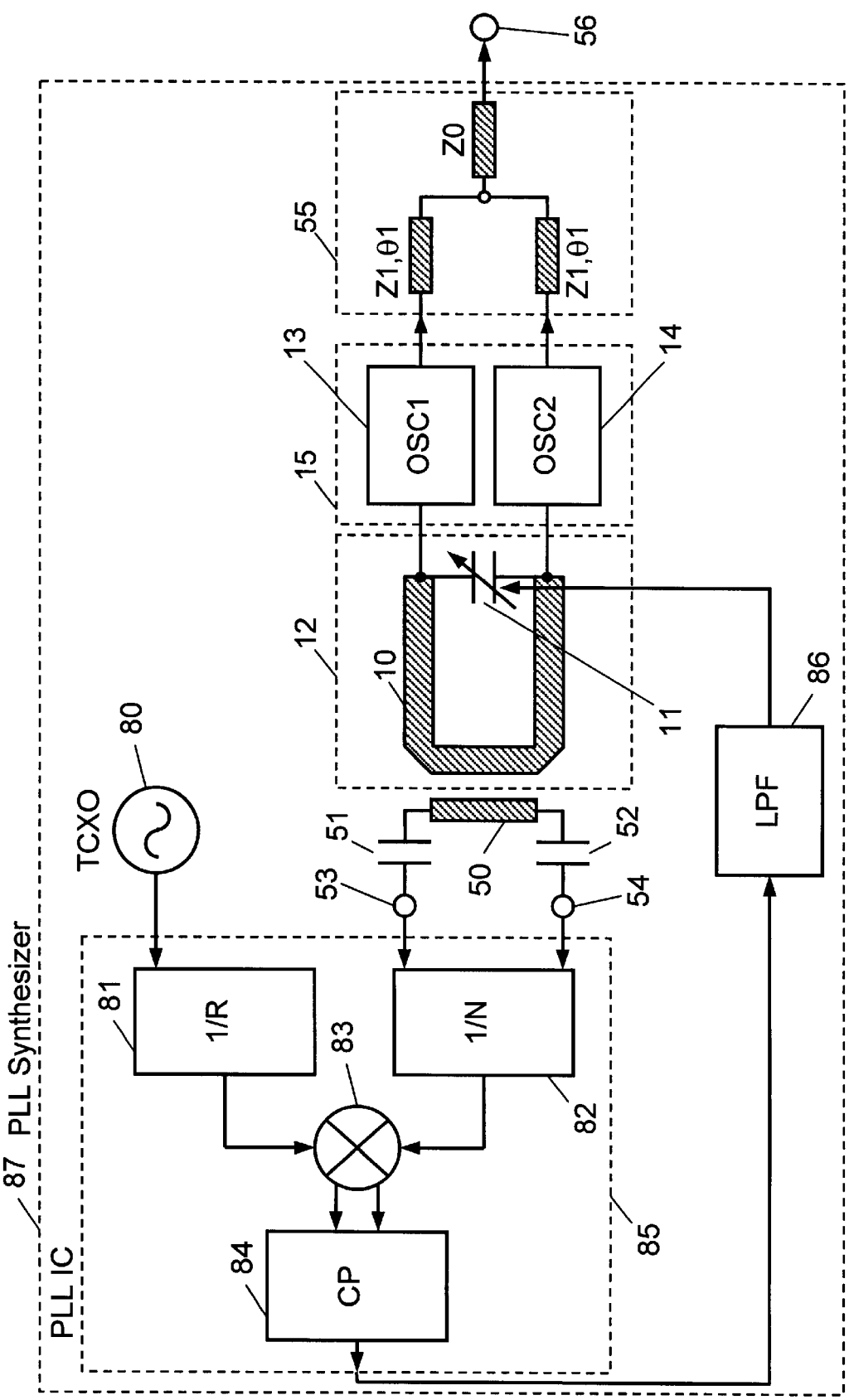
FIG. 8 is a block diagram of a PLL synthesizer employing a push—push oscillator in accordance with an eighth exemplary embodiment of the present invention.

FIG. 8 is a block diagram of a PLL synthesizer employing a push—push oscillator in accordance with the eighth exemplary embodiment of the present invention. Elements 10–15 and 50–56 used in this eighth embodiment are the same as those in the fifth embodiment. As a standard signal source 80, a temperature-compensated-crystal-oscillator (TCXO) having highly stable oscillation characteristics is often used. Frequency divider 81 having a division number of integer "R" comprises a CMOS counter, and frequency divider 82 having a division number of integer "N" comprises a differential emitter coupled logic (ECL) and a CMOS counter. Output signals of the oscillator are fed from fundamental output terminals 53 and 54 into frequency divider 82 in double phases, so that they turn to signals having a frequency divided into 1/N. On the other hand, the signals of standard signal source 80 undergo frequency divider 81, so that they turn to signals having a frequency divided into 1/R. Phase comparator 83 detects phase errors between these two signals, and charge pump 84 produces current pulses having a pulse width responsive to the error signal and outputs the current pulses through PLL IC 85. Then LPF 86 removes ac components from the current pulses, thereby outputting a dc voltage. This output signal controls a capacitance of voltage-controlled-capacitance 11 so that the circuit shown in FIG. 8 practices a PLL operation. As a result, signals phase-locked with standard-signal-source 80 can be supplied from terminal 56. In this embodiment, output terminals 53 and 54 of the oscillator can be coupled with the input terminals of frequency divider 82 in double phases, thus a PLL synthesizer having excellent noise immunity is obtainable. Since this oscillator can output the fundamental wave and even-order harmonics independently at the same time from respective output terminals disposed at the oscillator, the PLL synthesizer can be downsized and simplified. Other operations as an oscillator are the same as those in the fifth embodiment. The differential ECL used in this eighth embodiment can be replaced with a differential source coupled logic (SCL) with the same effect.

Exemplary Embodiment 9

Figure 9:
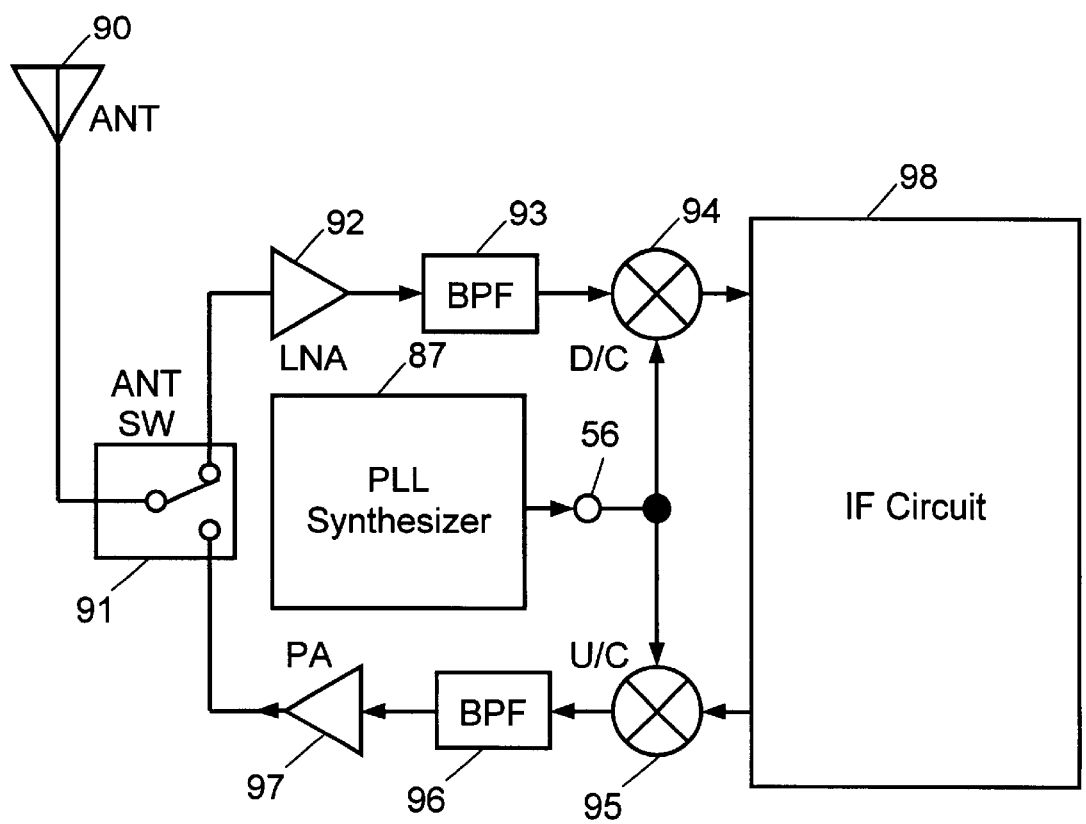
FIG. 9 is block diagram of a wireless communication apparatus employing a push—push oscillator in accordance with a ninth exemplary embodiment of the present invention.
Figure 10A:
FIG. 10A is a plan view of a conventional resonator.
Figure 10B:
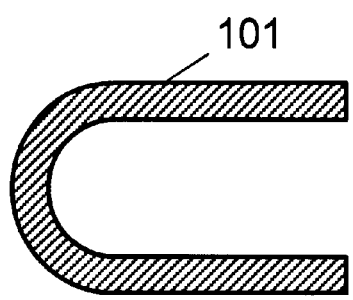
FIG. 10B is a plan view of a conventional hairpin type resonator.
Figure 10C:
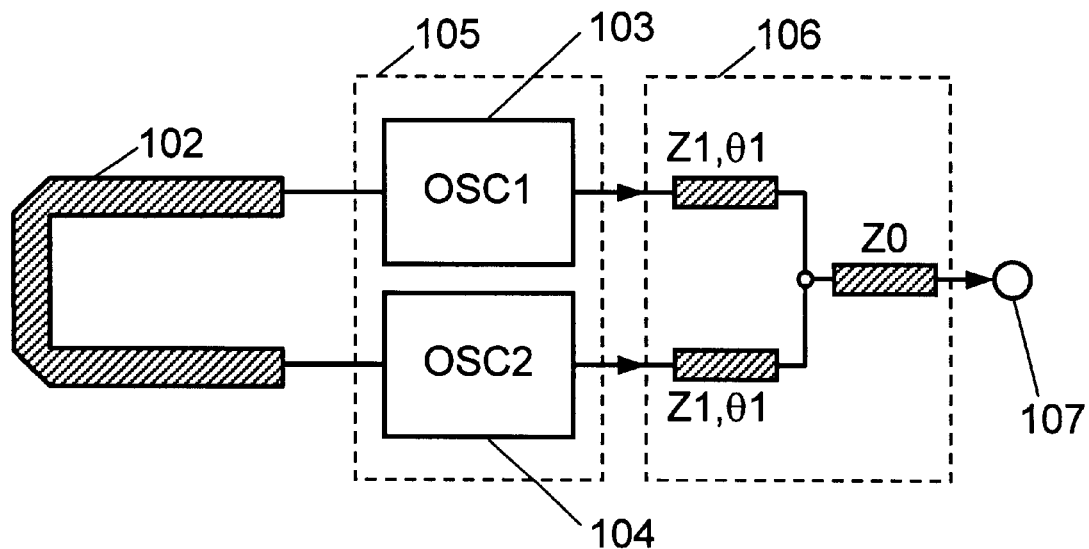
FIG. 10C is a block diagram of a conventional push—push oscillator.

FIG. 9 is a block diagram of a wireless communication apparatus employing a push—push oscillator in accordance with the ninth exemplary embodiment of the present invention. Elements 56 and 87 used in this ninth embodiment are the same as those in the eighth embodiment, the descriptions thereof are thus omitted. Antenna 90 is a receiving/transmitting antenna for receiving and transmitting radio-frequency-waves. Antenna switch 91 switches antenna 90 between a receiving circuit and a transmission circuit. This apparatus acts as follows at receiving: a modulated signal received by antenna 90 and undergone antenna switch 91 is weak in general, and amplifier 92 thus amplifies this signal so that least noises are added to the signal. Band-pass-filter (BPF) 93 suppresses unnecessary waves in the signal, then down-converter 94 which employs PLL synthesizer 87 as a local oscillator converts the signal into an intermediate frequency (IF). Finally, IF circuit 98 demodulates the signal. At transmitting, up-converter 95 employing PLL synthesizer 87 as a local oscillator converts a modulated signal supplied from IF circuit 98 into a high frequency. After BPF 96 suppresses unnecessary waves in the signal, amplifier 97 amplifies the signal up to an output power level required. The signal undergone antenna switch 91 is radiated by antenna 90 into free space. In this embodiment, both at receiving and transmitting, since PLL synthesizer 87 being downsized and simplified as well as having excellent noise immunity functions also as a local oscillator, the wireless communication apparatus in accordance with this ninth embodiment can be downsized and simplified as well as have excellent noise immunity. Other operations as a PLL synthesizer are the same as those in the eighth embodiment, thus the descriptions thereof are omitted.

As discussed above, the push—push oscillator of the present invention embodies the following advantages:

(a) The oscillator outputs a fundamental wave from an oscillator circuit, and also outputs even-order-harmonics through coupling by rf electric field in a single phase at a midpoint of a transmission line.

(b) The oscillator inputs even-order-harmonics through coupling by rf electric field in a single phase at the midpoint of the transmission line.

(c) The oscillator outputs the fundamental wave in double phases through coupling by rf magnetic field near the midpoint of the transmission line, and outputs the even-order-harmonics in a single phase from the oscillator circuit via an in-phase addition circuit.

These advantages allow the oscillator to be downsized and simplified comparing with a conventional one, and to function as a frequency divider. The present invention also provides devices and instruments which can accommodate the push—push oscillator.

What is claimed is:

1. A push—push oscillator operating with a high frequency comprising:

(a) a resonator circuit comprising:
a transmission line of which first and second ends are left open; and
a capacitance for frequency control coupled with said transmission line in parallel;

(b) an oscillator circuit comprising:
a first branch oscillator coupled with the first end at an input side of said first branch oscillator; and
a second branch oscillator electrically identical to said first branch oscillator, said second branch being coupled with the second end at an input side of said second branch oscillator;

(c) a first and a second fundamental-wave-terminals coupled to respective output terminals of said first and said second branch oscillators; and (d) an even-order-harmonic-output-terminal coupled to, via a coupling capacitance, a midpoint of said transmission line in a transmitting direction.

2. The push—push oscillator as defined in claim 1 wherein said transmission line forms two coaxial resonators which are electrically identical, of which respective inner conductors are coupled with each other at one contacting point on a side of first end, and of which respective second end faces are left open, and wherein said even-order-harmonic-output-terminal is coupled to the contacting point via a coupling capacitance.

3. The push—push oscillator as defined in claim 1 wherein said first and said second fundamental-wave-output-terminals are coupled to input terminals in double phases of one of a differential amplifier and a frequency divider, which is included in a PLL synthesizer.

4. The push—push oscillator as defined in claim 1 wherein said first and said second fundamental-wave-output-terminals are coupled to input terminals in double phases of one of a differential amplifier and a frequency divider, which is included in a PLL synthesizer employed in a wireless communication apparatus.

5. A push—push oscillator operating with a high frequency comprising:

(a) a resonator circuit comprising:

a transmission line of which first and second ends are left open; and a capacitance for frequency control coupled with said transmission line in parallel;

(b) an oscillator circuit comprising:

a first branch oscillator coupled with the first end at an input side of said first branch oscillator; and a second branch oscillator electrically identical to said first branch oscillator, said second branch being coupled with the second end at an input side of said second branch oscillator;

(c) a first and a second fundamental-wave-terminals coupled to respective output terminals of said first and said second branch oscillators; and (d) an even-order-harmonic-input-terminal coupled to, via a coupling capacitance, a midpoint of said transmission line in a transmitting direction.

6. The push—push oscillator as defined in claim 5 wherein said transmission line forms two coaxial resonators which are electrically identical, of which respective inner conductors are coupled with each other at one contacting point on a side of first end, and of which respective second end faces are left open, and wherein said even-order-harmonic-input-terminal is coupled to the contacting point via a coupling capacitance.

7. A push—push oscillator operating with a high frequency comprising:

(a) a resonator circuit comprising:

a transmission line of which first and second ends are left open; and a capacitance for frequency control coupled with said transmission line in parallel;

(b) an oscillator circuit comprising:

a first branch oscillator coupled with the first end at an input side of said first branch; and a second branch oscillator electrically identical to said first branch oscillator, said second branch being coupled with the second end at an input side of said second branch;

(c) an in-phase addition circuit outputting a signal formed by adding up respective output signals of said first and said second branch oscillators;

(d) an even-order-harmonic-output-terminal coupled to an output side of said in-phase addition circuit;

(e) a coupling line disposed in parallel near a midpoint of said transmission line in a transmitting direction; and (f) a first and a second fundamental-wave-terminals coupled to both ends of said coupling line via a coupling capacitance.

8. The push—push oscillator as defined in claim 7 wherein said transmission line and said coupling line are formed by film of strip conductor placed on a dielectric layer, wherein said respective conductor films sandwich said dielectric layer in between, and wherein part of said transmission line and said coupling line overlies each other with said dielectric layer in between.

9. The push—push oscillator as defined in claim 7 wherein said transmission line is formed by two sheets of said conductor films, both are identically shaped, and these two films sandwich said dielectric layer in between and the two films overlie each other completely, and wherein respective ends of the two films are coupled each other with conductive through-holes.

10. The push—push oscillator as defined in claim 7 wherein said first and said second fundamental-wave-output-terminals are coupled to input terminals in double phases of one of a differential amplifier and a frequency divider, which is included in a PLL synthesizer.

11. The push—push oscillator as defined in claim 7 wherein said first and said second fundamental-wave-output-terminals are coupled to input terminals in double phases of one of a differential amplifier and a frequency divider, which is included in a PLL synthesizer employed in a wireless communication apparatus.

* * * * *